(12) United States Patent
Kim et al.

(10) Patent No.: US 7,729,173 B2
(45) Date of Patent: Jun. 1, 2010

(54) METHOD FOR TESTING INTERNAL HIGH VOLTAGE IN NONVOLATILE SEMICONDUCTOR MEMORY DEVICE AND RELATED VOLTAGE OUTPUT CIRCUIT

(75) Inventors: Chae-Hoon Kim, Yongin-si (KR); Dae-Han Kim, Gangdong-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/957,808

(22) Filed: Dec. 17, 2007

(65) Prior Publication Data

US 2008/0170450 A1   Jul. 17, 2008

(30) Foreign Application Priority Data

Jan. 17, 2007   (KR) ..................... 10-2007-0005035

(51) Int. Cl.
 *G11C 11/34* (2006.01)
 *G11C 5/14* (2006.01)
 *G11C 8/00* (2006.01)

(52) U.S. Cl. .................... 365/185.18; 365/185.03; 365/185.19; 365/185.29; 365/185.33; 365/226; 365/233.1

(58) Field of Classification Search ............ 365/185.03, 365/185.18, 185.19, 185.21, 185.23, 185.29, 365/185.33, 201, 226, 233.1; 700/292
See application file for complete search history.

(56) References Cited

U.S. PATENT DOCUMENTS

| | | | | |
|---|---|---|---|---|
| 5,815,425 | A * | 9/1998 | Wong et al. | 365/185.03 |
| 5,909,393 | A * | 6/1999 | Tran et al. | 365/185.03 |
| 5,963,462 | A * | 10/1999 | Engh et al. | 365/185.03 |
| 5,973,959 | A * | 10/1999 | Gerna et al. | 365/185.03 |
| 6,288,934 | B1 * | 9/2001 | Aikawa | 365/185.03 |
| 6,944,058 | B2 * | 9/2005 | Wong | 365/185.03 |
| 7,260,452 | B2 * | 8/2007 | See et al. | 700/292 |
| 7,349,255 | B2 * | 3/2008 | Wong | 365/185.23 |
| 2004/0032353 | A1 | 2/2004 | Kattan | |
| 2005/0024330 | A1 | 2/2005 | Astrauskas | |

\* cited by examiner

*Primary Examiner*—Trong Phan
(74) *Attorney, Agent, or Firm*—Volentine & Whitt, PLLC

(57) ABSTRACT

In a voltage output circuit of a nonvolatile semiconductor memory device, a high voltage generator generates an internal high voltage, a sampling signal generator generates a sampling signal, and a sample and old circuit samples and holds the internal high voltage in accordance with the sampling signal.

8 Claims, 8 Drawing Sheets

METHOD FOR TESTING INTERNAL HIGH VOLTAGE IN NONVOLATILE SEMICONDUCTOR MEMORY DEVICE AND RELATED VOLTAGE OUTPUT CIRCUIT

CROSS-REFERENCE TO RELATED APPLICATIONS

This application claims priority to Korean Patent Application No. 10-2007-0005035, filed on Jan. 17, 2007, the disclosure of which is hereby incorporated by reference.

BACKGROUND OF THE INVENTION

1. Field of the Invention

Embodiments of the invention relate generally to nonvolatile semiconductor memory devices. More particularly, selected embodiments of the invention relate to a high voltage output circuit for a nonvolatile semiconductor memory device and a method for measuring an internal high voltage generated by the high voltage output circuit.

2. Description of Related Art

Semiconductor memory devices can be roughly divided into two categories including volatile memories and nonvolatile memories. Volatile memories tend to have faster performance compared with nonvolatile memories; however, volatile memories lose stored data when disconnected from an external power source. On the other hand, nonvolatile memories tend to have efficient performance while providing the additional benefit of maintaining stored data even when disconnected from an external power source. As a result, nonvolatile memories have continued to be an increasingly popular form of data storage for a variety of devices, including devices where power is limited or may be lost unexpectedly.

Examples of nonvolatile semiconductor memory devices include masked read only memory (MROM), programmable read only memory (PROM), erasable programmable read only memory (EPROM), and electrically erasable programmable read only memory (EEPROM), to name but a few.

Unfortunately, data stored in some forms of nonvolatile memory, such as MROM, PROM, and EPROM, cannot be readily updated. For example, MROM, PROM, and EPROM cannot be erased using electrical signals. On the other hand, data stored in EEPROM can be readily erased, read, and programmed using electrical signals. Because of this capability, EEPROM is among the more popular and commonly used forms of nonvolatile memory in existence today.

In addition, many data storage devices such as digital cameras, cellular phones, etc., are required to be compact in the size. As a result, system designers are interested in the development of EEPROMs occupying a relatively small amount of space. As a result, the size of EEPROMs has continued to decrease and the integration density of the EEPROMs has continued to increase.

One type of EEPROM with relatively good performance, size, and integration density is flash EEPROM. Because of these good qualities, flash EEPROM is commonly used to provide mass data storage or semi-permanent code storage for devices such as personal computers and portable electronic devices.

Flash EEPROM (hereafter "flash memory") can be roughly categorized according to the organization and type of memory cells therein. Different categories of flash memory include, for example, NAND type flash memory, NOR type flash memory, and AND type flash memory.

FIG. 1 is a block diagram of a conventional nonvolatile semiconductor memory device. The device of FIG. 1 is described in further detail in U.S. Patent Publication No. 2002/0024330.

In FIG. 1, a flash memory comprises an input/output buffer 22, a memory cell array 10, an X decoder 12, a Y decoder 18, a register 14, a Y gate 16, a read/write circuit 20, a command decoder 24, a read/write/erase control circuit 26, a reference voltage (REF) generator 28 for generating a reference voltage, and HV generators 30 and 32 for producing internal high voltage.

FIG. 2 is a circuit diagram providing a more detailed view of the memory cell array shown in FIG. 1 and FIG. 3 is a sectional view illustrating a memory cell of the circuit diagram of FIG. 2.

FIG. 2 illustrates a NOR type memory cell array structure in which a memory cell transistor is coupled to every intersection of word lines WL1-WLn and bit lines BL1-BLn. Each memory cell transistor comprises a metal oxide semiconductor (MOS) transistor having a floating gate FG and a control gate CG. A drain node "D" of a memory cell transistor MC1 is coupled to a corresponding bit line BL1, a source node "S" is connected to ground, and control gate CG is connected to word line WL1.

Memory cell transistor MC1 has a sectional face illustrated in FIG. 3. Referring to FIG. 3, electrons are injected into a floating gate 7 of memory cell transistor MC1 in a program operation, or electrons stored in floating gate 7 are transferred to a substrate 2 in an erase operation. The program operation can be performed, e.g., using a conventional technique such as hot-electron injection, and the erase operation can be performed, e.g., using a conventional technique such as Fowler-Nordheim (F-N) tunneling.

In a conventional erase operation, a voltage of about 6-8 volts is applied to substrate 2 and a voltage of about −10 volts is applied to control gate CG. Under these conditions, a voltage difference between control gate CG and substrate 2 generates an electrical field on floating gate FG such that the electrons stored in floating gate FG are removed onto substrate 2. The erase operation lowers a threshold voltage Vt of memory cell transistor MC1. Where threshold voltage Vt is sufficiently lowered such that current flows through a channel region of memory cell transistor MC1 during a read operation, memory cell transistor MC1 is considered to be successfully erased. In most flash memory systems, and for purposes of this written description, it will be assumed that a memory cell transistor (or more simply "a memory cell") having such an erased state is considered to store a logical "1".

In a conventional program operation, a voltage of 0 volts is applied to source "S" and drain "D" and a voltage of about 10 volts is applied to control gate CG. Under these conditions, an electrical field is generated on floating gate FG such that electrons are transferred from the channel region of memory cell transistor MC1 to floating gate FG via hot-electron injection, thereby increasing threshold voltage Vt of memory cell transistor MC1. Where threshold voltage Vt increases to about 5-9 volts such that current is prevented from flowing across the channel region memory cell transistor MC1 during a read operation, memory cell transistor MC1 is considered to be successfully programmed. In most flash memory systems, and for purposes of this written description, it will be assumed that a memory cell transistor having such a programmed state is considered to store a logical "0".

In a conventional read operation, a read voltage of about 4.5V is applied to control gate CG of memory cell transistor MC1, and source "S" and substrate 2 are both connected to ground. Under these conditions, current will flow or not flow in a corresponding bit line based on a program state of memory cell transistor MC1. Where threshold voltage Vt of memory cell transistor MC1 is greater than a reference value, substantially no current will flow through the corresponding bit line, indicating a program state of logical "0". Otherwise, current will flow through the corresponding bit line, indicating a program state of logical "1". According to the presence or absence of current flow, the corresponding bit line will assume a high voltage level or a low voltage level, respectively.

Although the operation of a single memory cell transistor MC1 has been described above, the structure and operation of other memory cell transistors illustrated in FIG. 2 have substantially the same structure and function as memory cell transistor MC1.

A NOR-type flash memory device having memory cell transistors such as those illustrated in FIGS. 2 and 3 typically requires a negative voltage or a high voltage greater than a power supply voltage of the device in order to perform program, erase, and read operations. In the example of FIG. 1, such voltages are produced by HV generators 30 and 32. HV generators 30 and 32 undergo a setting operation in a manufacture step performed immediately after a fabrication of semiconductor memory device. The setting operation typically includes a testing operation used to determine whether HV generators 30 and 32 generate output voltages with desired amplitudes and an adjusting operation used to adjust the amplitudes of the output voltages based on the testing operation.

Conventionally, the respective output voltages of HV generators 30 and 32 are sampled at multiple time points to achieve measurements of their respective amplitudes. Such multiple sampling may be required due to fluctuations in the amplitude of the output voltages over time. In general, the number of total repetitive measurements can be in the hundreds to thousands. Unfortunately, however, such repetitive sampling tends to increase the time required to perform the setting operation, and in some cases it may not produce accurate measurements.

In addition, other operating voltages such as a read voltage may depend on the accuracy of the output voltages of HV generators 30 and 32. For example, the amplitude of the read voltage may change in accordance with vibrations of an internal high voltage having an amplitude controlled by output voltages of HV generators 30 and 32.

The difficulty of accurately measuring the output voltages of HV generators 30 and 32 may perhaps be better understood by referring to an example of a conventional high voltage generator 100 illustrated in FIGS. 4 and 5. A typical method of testing an output of high voltage generator 100 is also described below with reference to FIGS. 4 and 5.

Referring to FIG. 4, high voltage generator 100 generates an internal high voltage Int. HV. High voltage generator comprises a control logic unit 40, an oscillator 42, a high voltage pump 44, and a high voltage regulator 46. Internal high voltage Int. HV is output through an output node connected to a pad 50. The output node is also connected to external test equipment used to measure internal output voltage Int. HV.

Where the level of internal high voltage Int. HV output from high voltage generator 100 vibrates at regular or irregular cycles as shown in FIG. 5, measurement values at respective measured times t1, t2 and t3 are individually different. That is, the measurement values change according to a vibration amplitude RB of internal high voltage Int. HV, causing a drop in reliability of an overall measurement. Because of this measurement variation, hundreds of thousands of measurements may be required in order to generate a reliable measure of the amplitude of internal high voltage Int. HV.

SUMMARY OF THE INVENTION

According to one embodiment of the invention, a voltage output circuit for a nonvolatile semiconductor memory device is provided. The circuit comprises a high voltage generator generating an internal high voltage, a sampling signal generator generating a sampling signal in response to a selection signal generated according to a mode of the voltage output circuit, and a sample and hold circuit sampling the internal high voltage output in response to the sampling signal to produce a sample of the internal high voltage output, and holding the sample for a predetermined time interval.

According to another embodiment of the invention, a method of measuring the amplitude of an internal high voltage generated by a high voltage generator in a voltage output circuit of a nonvolatile semiconductor memory device is provided. The method comprises generating a sampling signal in response to a selection signal generated according to a mode of the voltage output circuit, sampling the internal high voltage in response to the activation of the sampling signal to produce a sample of the internal high voltage output, holding the sample for a predetermined time, and measuring the sample during the predetermined time through an output pad of the voltage output circuit.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples while the actual scope of the invention is defined by the claims that follow.

According to selected embodiments of the invention, in measuring an internal high voltage output from a high voltage generator included in a chip of a nonvolatile semiconductor memory device, the internal high voltage is measured by appropriate sampling under controlled conditions and at a specific time point. In an embodiment illustrated in FIG. 6, such a measurement is obtained by using a sampling signal generator and a sample and hold circuit.

Figure 1:
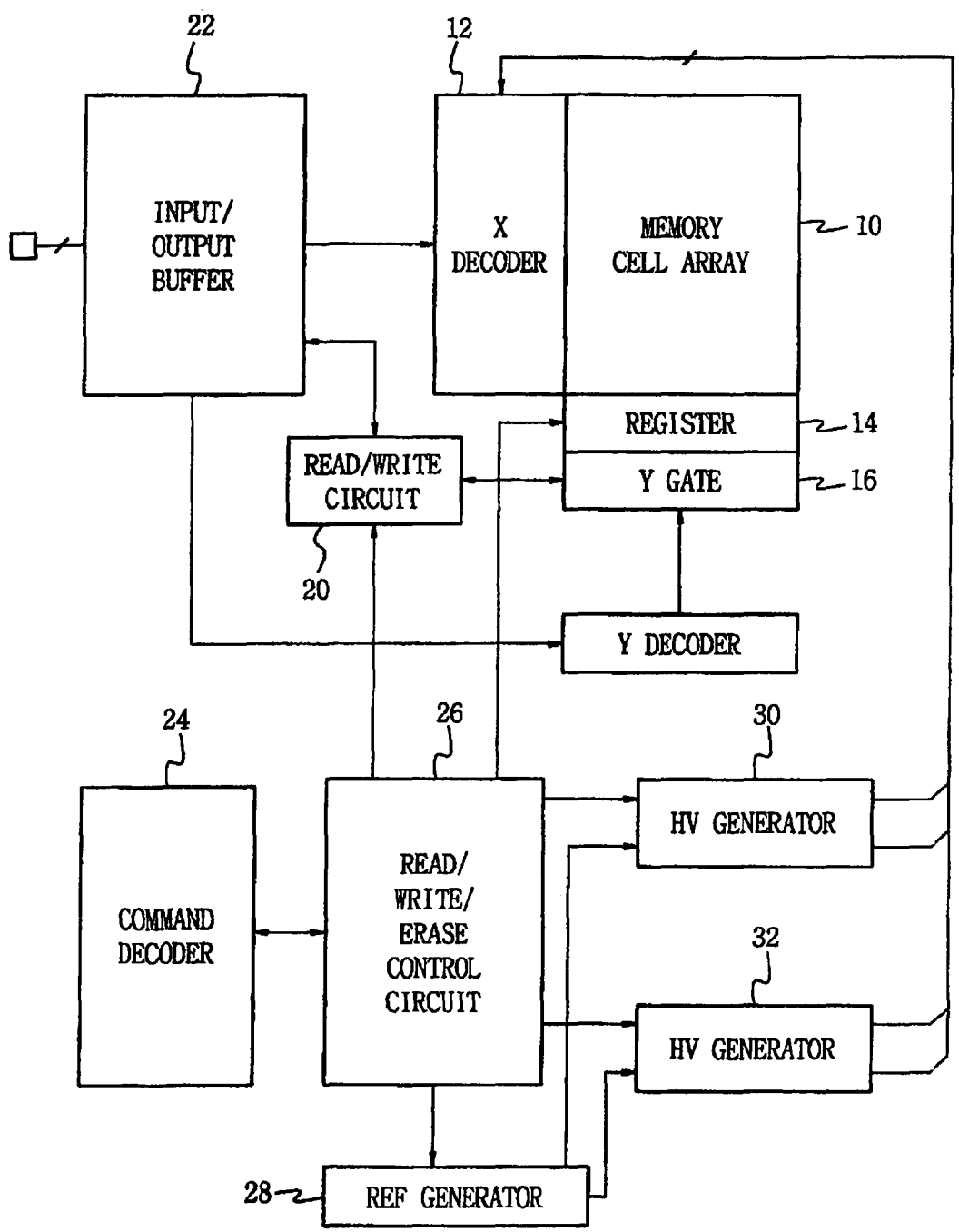
FIG. 1 is a block diagram of a conventional nonvolatile semiconductor memory device.
Figure 2:
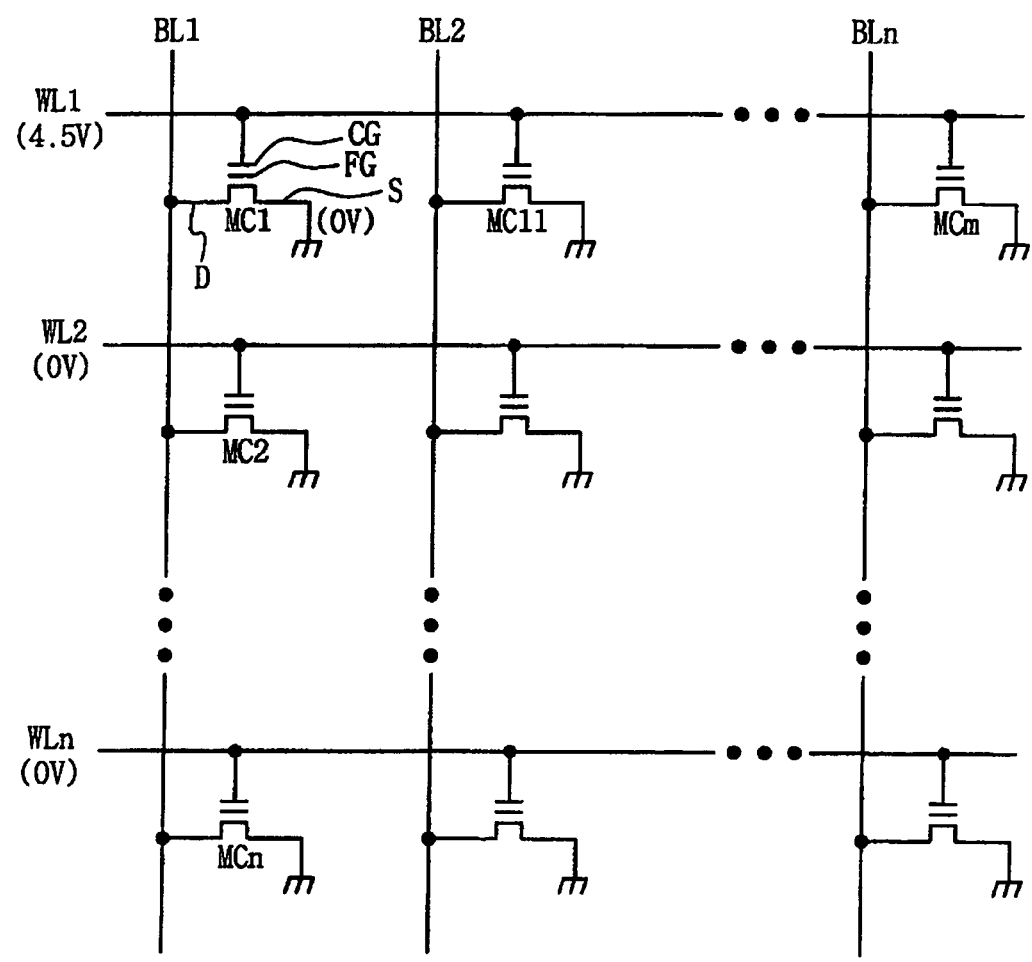
FIG. 2 is a circuit diagram illustrating a memory cell array shown in FIG. 1.
Figure 3:
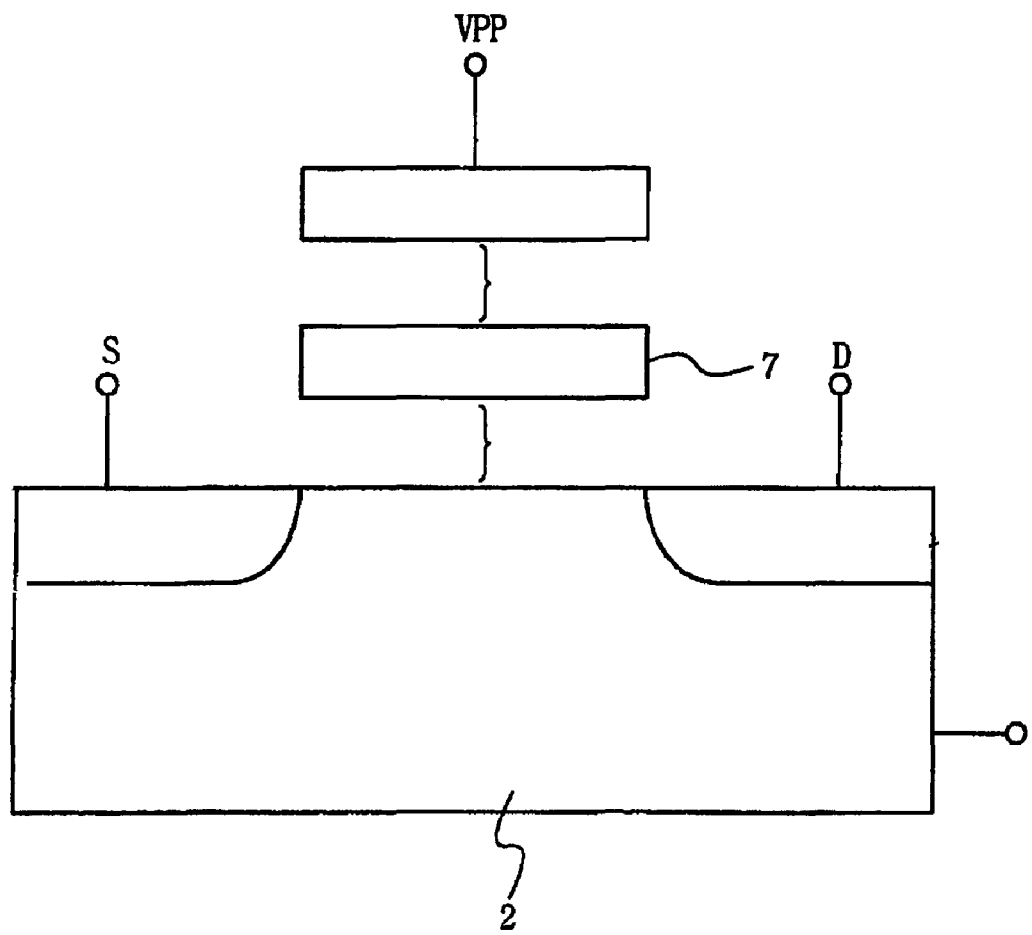
FIG. 3 is a sectional diagram illustrating a memory cell transistor shown in FIG. 2.
Figure 4:
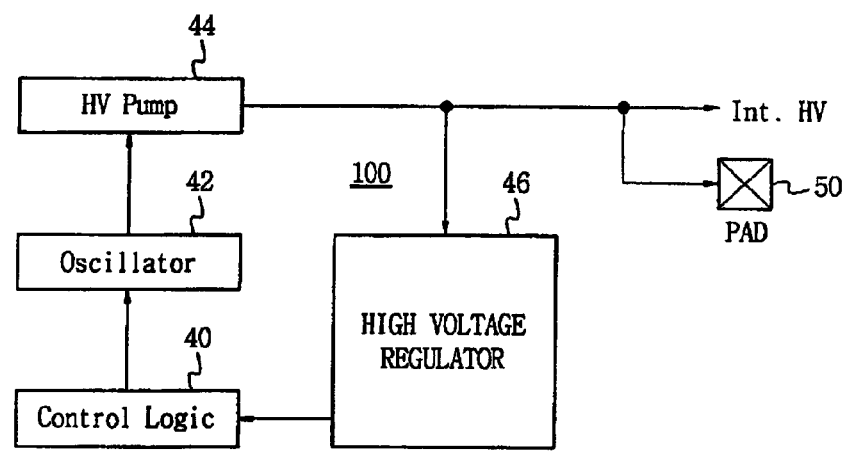
FIG. 4 is a block diagram illustrating a high voltage generator shown in FIG. 1.
Figure 5:
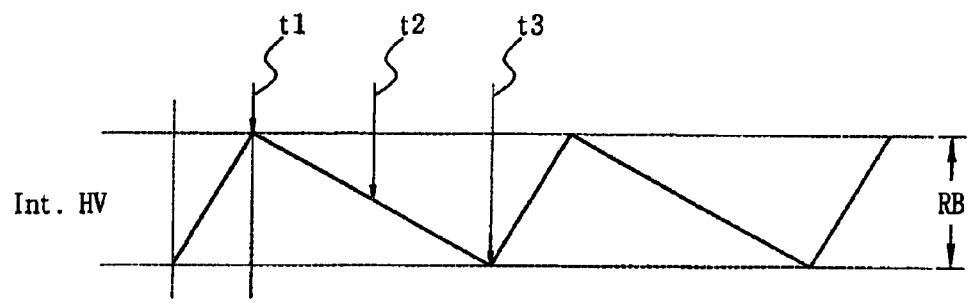
FIG. 5 is a waveform diagram illustrating the amplitude of an internal high voltage generated by the high voltage generator of FIG. 4.
Figure 6:
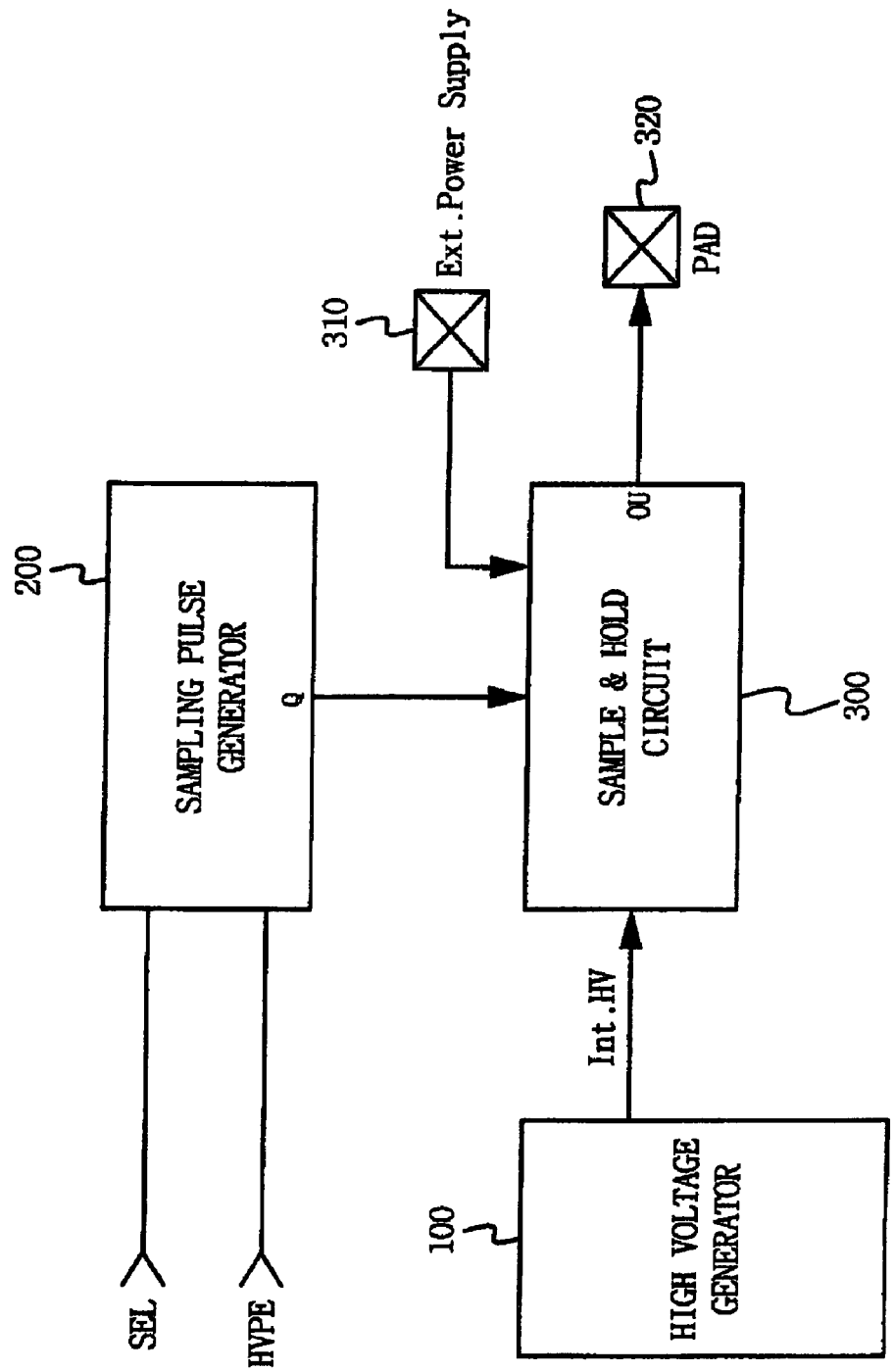
FIG. 6 is a block diagram of a voltage output circuit according to an embodiment of the invention.

FIG. 6 is a block diagram of a voltage output circuit according to one embodiment of the invention. Referring to FIG. 6, the voltage output circuit comprises high voltage generator 100 illustrated in FIG. 4, a sampling signal (or pulse) generator 200, and a sample and hold circuit 300.

High voltage generator 100 is described above with reference to FIG. 4. In addition, a high voltage generator similar to high voltage generator 100 is described in further detail in U.S. Pat. No. 5,291,446 issued on Mar. 1, 1994.

Sampling signal generator 200 generates a sampling signal "Q" in response to a selection signal SEL in order to sample internal high voltage Int. HV output from high voltage generator 100.

Sample and hold circuit 300 performs a sampling operation on internal high voltage Int. HV in response to sampling signal "Q" of sampling signal generator 200, and holds the sampled internal high voltage Int. HV for a predetermined time interval. The sampled internal high voltage Int. HV is then output through a pad 320, and an operating voltage, i.e., external power voltage Ext. Power Supply, is applied to sample and hold circuit 300 through a pad 310.

Figure 7:
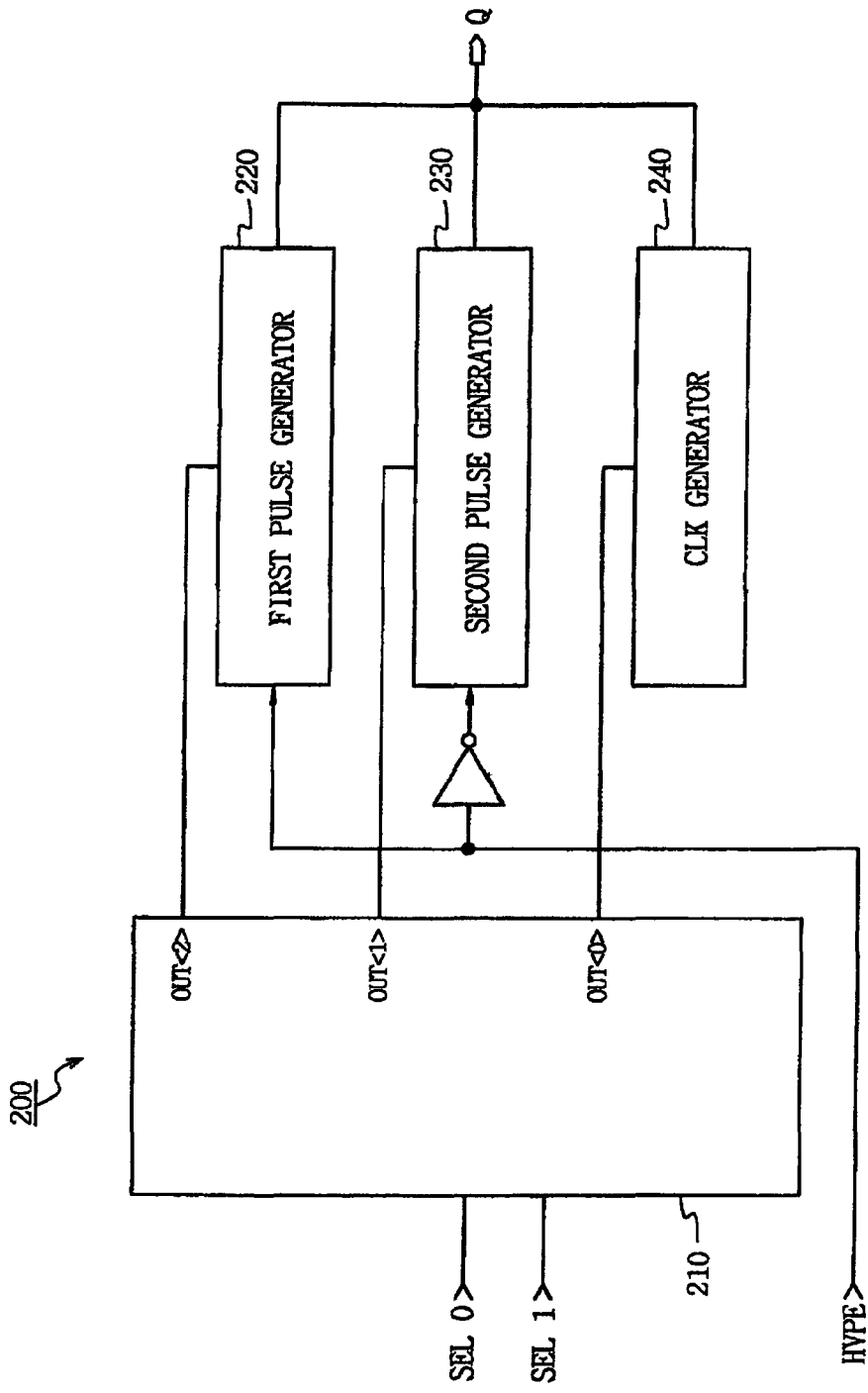
FIG. 7 is a block diagram illustrating an example of a sampling signal generator shown in FIG. 6.

FIG. 7 is a block diagram illustrating an example of sampling signal generator 200 in further detail. Referring to FIG. 7, sampling signal generator 200 comprises a mode selection switch 210 for outputting selection mode decision signals OUT<0>, OUT<1>, OUT<2> for performing a sampling of a minimum value, a maximum value, or of overall waveforms, respectively based on different modes of the voltage output circuit. Selection mode decision signals OUT<0>, OUT<1>, and OUT<2> are generated in response to external selection input data SEL0, SEL1 (typically derived from selection signal SEL, e.g., by de-multiplexing, buffering, or by simple transmission).

Sampling signal generator 200 further comprises a first pulse generator 220, a second pulse generator 230, and a clock generator 240. First pulse generator 220 generates a first sampling pulse in response to a high voltage pump enable signal HVPE and activation of selection mode decision signal OUT<2>. Second pulse generator 230 generates a second sampling pulse in response to high voltage pump enable signal HVPE and activation of selection mode decision signal OUT<1>. Clock generator 240 generates a periodic clock signal in response to high voltage pump enable signal HVPE and activation of selection mode decision signal OUT<0>.

In the example of FIG. 7, mode selection switch 210 is a 2-input 3-output de-multiplexer; however the number of inputs and outputs could be readily modified.

Figure 8:
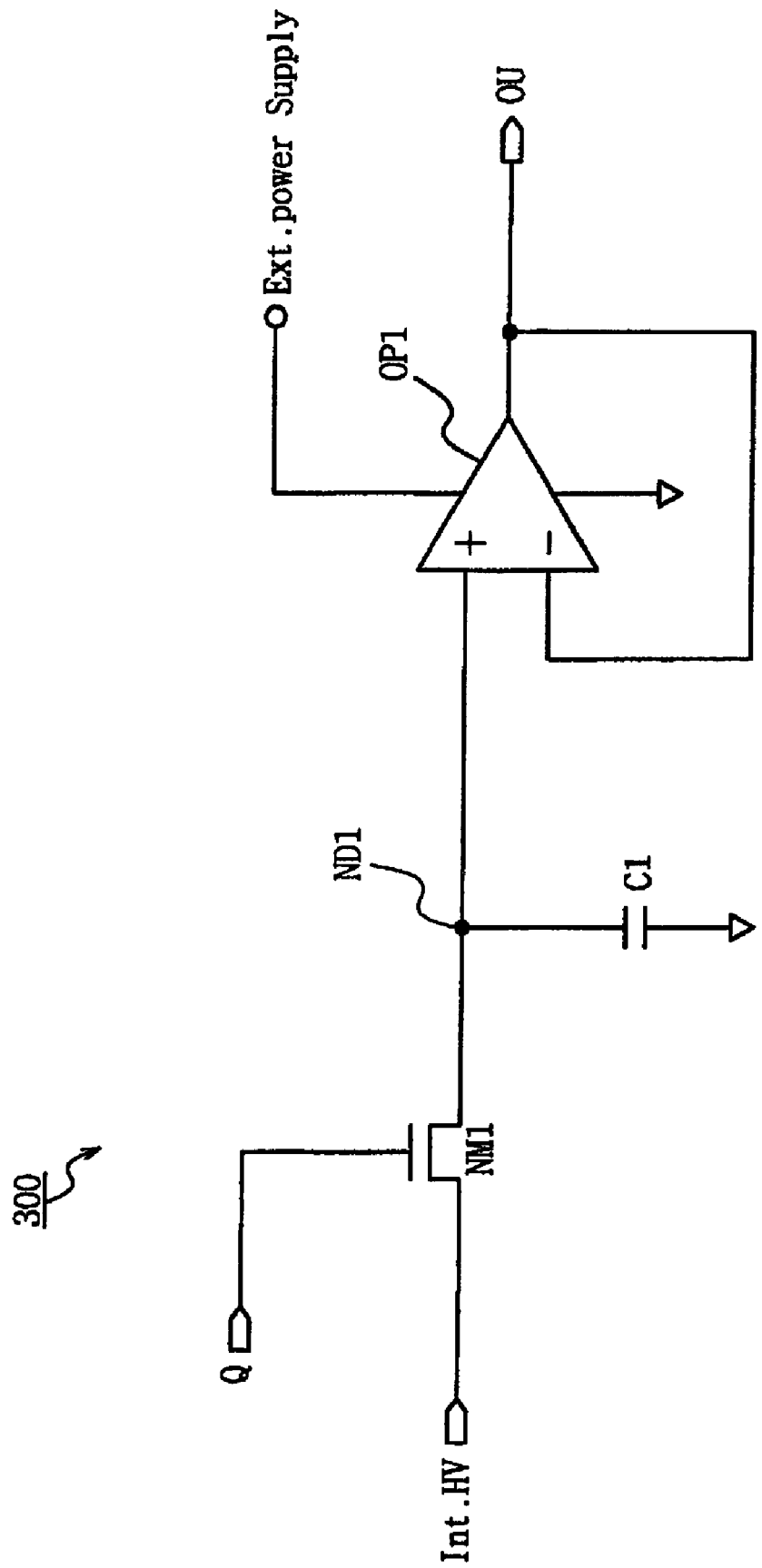
FIG. 8 is a circuit diagram illustrating an example of a sample and hold circuit shown in FIG. 6.

FIG. 8 is a circuit diagram illustrating an example of sample and hold circuit 300 shown in FIG. 6. Referring to FIG. 8, sample and hold circuit 300 comprises an input switching unit NM1 for transferring internal high voltage Int. HV from high voltage generator 100 to a sampling node ND1 when sampling signal "Q" is activated. Sample and hold circuit 300 further comprises a charge storage unit C1 for storing internal high voltage Int. HV transferred to sampling node ND1, and a hold level output unit OP1 for maintaining internal high voltage Int. HV stored in charge storage unit C1 for a predetermined time, and outputting internal high voltage Int. HV through an output terminal OU.

In the example of FIG. 8, input switching unit NM1 comprises a N-channel metal oxide semiconductor (NMOS) transistor receiving sampling signal "Q" through a gate terminal and receiving internal high voltage Int. HV through a drain terminal. However, in other embodiments, input switching unit NM1 may be implemented using other switching devices such as a P-channel metal oxide semiconductor (PMOS) transistor or transmission gate. Where a NMOS transistor is used as input switching unit NM1, a level shifter may also be used to shift a level of sampling signal "Q" to a level commensurate with a threshold voltage of the NMOS transistor.

In FIG. 8, charge storage unit C1 is illustrated as a capacitor connected between sampling node ND1 and ground. However, other implementations of charge storage unit C1 are possible. In addition, hold level output unit OP1 is illustrated as an operation amplifier operating by an external operating voltage and having a non-inverted terminal(+) connected to sampling node ND1, and an inverted terminal(−) connected to output terminal OU. However, hold level output unit OP1 could be implemented using other voltage level holding devices.

In general, internal high voltage Int. HV may have a level corresponding to a read voltage, a program voltage or an erase voltage for a NOR flash memory device.

Figure 9:
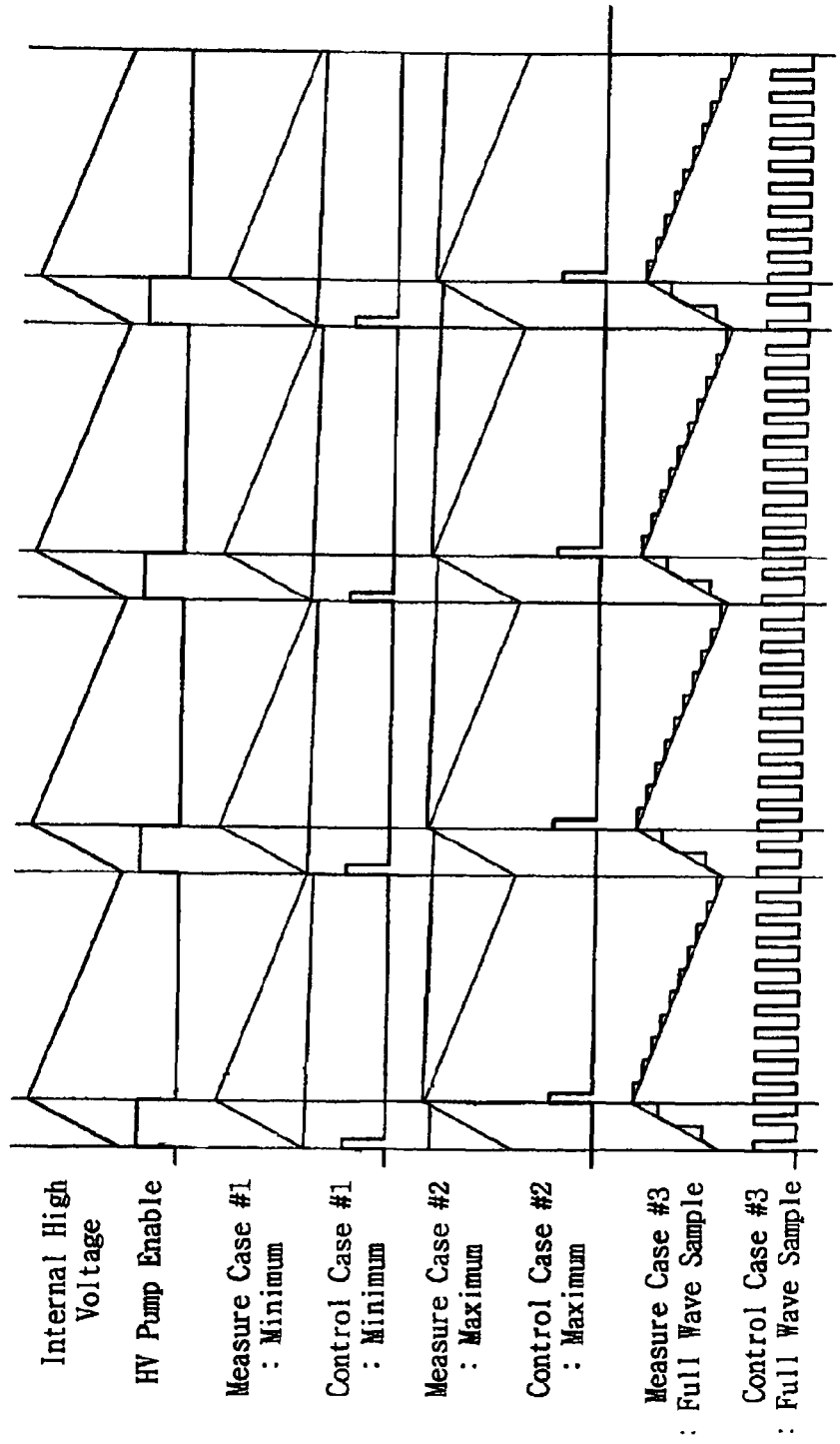
FIG. 9 is a waveform diagram illustrating various voltage output timings of the voltage output circuit shown in FIG. 6.

FIG. 9 is a waveform diagram illustrating the timing of various signals generated by the voltage output circuit of FIG. 6. More particularly, FIG. 9 illustrates waveforms of internal high voltage Int. HV and high voltage pump enable signal HVPE, and three waveforms for sample and hold output voltages obtained during respective activations of selection mode decision signals OUT<2>, OUT<1>, and OUT<0>.

Samples for minimum value and maximum values of internal high voltage Int. HV and overall waveforms of internal high voltage Int. HV are selectively measured, and examples of the measurements are described below with reference to FIGS. 6 through 9.

To measure a minimum value of internal high voltage Int. HV generated by high voltage generator 100, external selection input data SEL0 is set to '1' and external selection input data SEL1 is set to '0'. In general, data SEL0 and SEL1 can be set by a test signal generation device.

Next, selection mode decision signal OUT<2> of mode selection switch 210 is activated. At this time, selection mode decision signals OUT<1> and OUT<0> of mode selection switch 210 are inactivated. First pulse generator 220 is enabled to generate a first output pulse signal (labeled "Control Case #1: Minimum"), which is produced as a sampling signal "Q". Accordingly, sampling signal "Q" is a short pulse generated in response to a rising edge of high voltage pump enable signal HVPE.

Where the first output pulse signal is applied to a gate of NMOS transistor NM1, NMOS transistor NM1 is turned on, and a sampling and holding operation of sample and hold circuit 300 is performed. During a time interval where NMOS transistor NM1 is turned on, a minimum value of internal high voltage Int. HV is transferred to sampling node ND1 and stored in capacitor C1. Then, a first waveform (labeled "Measure Case #1: Minimum" and superimposed on the waveform of internal high voltage Int. HV) is generated at output terminal OU of operation amplifier OP1 as a minimum value of internal high voltage Int. HV. Capacitor C1 and operation amplifier OP1 hold the value of this first waveform for a given time. Consequently, the first waveform appears to have a level similar to a direct current DC. Thus, a test operator (e.g., an electronic measurement unit or circuit) can precisely and simply measure the minimum value of internal high voltage Int. HV using the first waveform.

To measure a maximum value of internal high voltage Int. HV generated by high voltage generator 100, external selection input data SEL0 is set to '0' and external selection input data SEL1 is set to '1'.

Next, selection mode decision signal OUT<1> of mode selection switch 210 is activated. At this time, selection mode decision signals OUT<2> and OUT<0> of mode selection switch 210 are inactivated. Also, second pulse generator 230 is enabled to generate a second output pulse signal (labeled "Control Case #2: Maximum"), which is produced as a sampling signal "Q". Accordingly, sampling signal "Q" is a short pulse generated in response to a falling edge of high voltage pump enable signal HVPE.

Where the second output pulse signal is applied to a gate of NMOS transistor NM1, NMOS transistor NM1 is turned on, and a sampling and holding operation of sample and hold circuit 300 is performed. During a time interval where NMOS transistor NM1 is turned on, a maximum value of internal high voltage Int. HV is transferred to sampling node ND1 and stored in capacitor C1. Then, a second waveform (labeled "Measure Case #2: Maximum" and superimposed on the waveform of internal high voltage Int. HV) is generated at output terminal OU of operation amplifier OP1 as a maximum value of internal high voltage Int. HV. Capacitor C1 and operation amplifier OP1 hold the value of this second waveform for a given time. Consequently, the second waveform appears to have a level similar to a direct current DC. Thus, a test operator can precisely and simply measure the maximum value of internal high voltage Int. HV using the second waveform.

To measure the pattern of the overall waveform of internal high voltage Int. HV output from high voltage generator 100, external selection input data SEL0 is set to '0' and external selection input data SEL1 is set to '0'.

Next, selection mode decision signal OUT<0> of mode selection switch 210 is activated. At this time, selection mode decision signals OUT<2> and OUT<1> of mode selection switch 210 are inactivated. Also, clock generator 240 is enabled to generate a full wave sample waveform (labeled "Control Case #3: Full Wave Sample"), which is produced as a sampling signal "Q". Accordingly, sampling signal "Q" is a clock pulse produced by clock generator 240 to generate a clock of predetermined frequency regardless of a state of high voltage pump enable signal HVPE.

Where the full wave sample waveform is applied to the gate of NMOS transistor NM1, NMOS transistor NM1 repeatedly turns on and off. As a result, sampled values covering the overall waveform of internal high voltage Int. HV are transferred to sampling node ND1, and a resulting third waveform (labeled "Measure Case #3: Full Wave Sample" and superimposed on the waveform of internal high voltage Int. HV) is generated at output terminal OU of the operation amplifier OP1 as samples for the overall waveform of internal high voltage Int. HV. Thus, the test operator can measure a level of full-wave value of internal high voltage Int. HV using the third waveform.

As described above, according to some embodiments of the invention, a measurement voltage is output as a signal similar to a direct current by using a sampling and hold technology. Using these techniques, a measurement time for the sampling and holding can be selected, the precision of the voltage measurement can be enhanced, and the time required to perform the voltage measurement can be reduced. Moreover, minimum and maximum values of internal high voltage and samples of overall waveforms can be selectively measured using a signal generated within a semiconductor memory device.

According to selected embodiments of the invention, a voltage output circuit and a related method of measuring an internal high voltage allow an internal high voltage to be measured with improved reliability and performance. As a result, selected embodiments of the invention allow output characteristics of a voltage generator within a chip of a semiconductor memory device to be measured quickly and precisely through external test equipment. In addition, a voltage setting operation of the voltage output circuit can be efficiently performed.

The foregoing exemplary embodiments are teaching examples. Those of ordinary skill in the art will understand that various changes in form and details may be made to the exemplary embodiments without departing from the scope of the invention as defined by the following claims.

What is claimed:

1. A voltage output circuit for a nonvolatile semiconductor memory device, the circuit comprising:
    a high voltage generator generating an internal high voltage;
    a sampling signal generator generating a sampling signal in response to a selection signal generated according to a mode of the voltage output circuit; and
    a sample and hold circuit sampling the internal high voltage output in response to the sampling signal to produce a sample of the internal high voltage output, and holding the sample for a predetermined time interval,
    wherein an output of the high voltage generator is electrically connected to an input of the sample and hold circuit; and
    the sampling signal generator comprises:
        a mode selection switch outputting first through third selection mode decision signals in response to external selection input data derived from the selection signal to perform a sampling of the minimum value of the internal high voltage, the maximum value of the internal high voltage, or of overall waveforms, respectively;
        a first pulse generator generating a first sampling pulse as the sampling signal in response to a rising edge of a high voltage pump enable signal and an activation of the first selection mode decision signal;
        a second pulse generator generating a second sampling pulse as the sampling signal in response to a falling edge of the high voltage pump enable signal and an activation of the second selection mode decision signal; and
        a clock generator generating a periodic clock signal as the sampling signal in response to activation of the third selection mode decision signal.

2. The circuit of claim 1, wherein the mode of the voltage output circuit is selected from among a mode for sampling only a minimum value of the internal high voltage, a mode for sampling only a maximum value of the internal high voltage, and a mode for sampling overall waveforms.

3. The circuit of claim 1, wherein the mode selection switch is a 2-input/3-output de-multiplexer.

4. The circuit of claim 3, wherein the sample and hold circuit comprises:
    an input switching unit transferring the internal high voltage output from the high voltage generator to a sampling node in response to activation of the sampling signal output by sampling pulse generator;
    a charge storage unit storing the internal high voltage transferred to the sampling node; and
    a hold level output unit for maintaining the internal high voltage stored in the charge storage unit for a predetermined time.

5. The circuit of claim 4, wherein the input switching unit comprises an N-channel metal-oxide semiconductor (NMOS) transistor having a gate terminal receiving the sampling signal and a drain terminal receiving the internal high voltage.

6. The circuit of claim 5, wherein the charge storage unit is a capacitor connected between the sampling node and ground.

7. The circuit of claim 6, wherein the hold level output unit comprises an operation amplifier operating by an external operating voltage, having an output terminal, a non-inverted terminal connected to the sampling node, and an inverted terminal connected to the output terminal.

8. A method of measuring the amplitude of an internal high voltage generated by a high voltage generator in a voltage output circuit of a nonvolatile semiconductor memory device, the method comprising:

generating a sampling signal in response to a selection signal generated according to a mode of the voltage output circuit;

sampling the internal high voltage in response to the an activation of the sampling signal to produce a sample of the internal high voltage output;

holding the sample for a predetermined time; and measuring the sample during the predetermined time through an output pad of the voltage output circuit wherein an output of the high voltage generator is electrically connected to an input of the sample and hold circuit and measuring the sample comprises:

providing first, second and third selection mode decision signals in response to external selection input data derived from the selection signal to perform a sampling of the minimum value of the internal high voltage, the maximum value of the internal high voltage, or of overall waveforms, respectively;

generating a first sampling pulse as the sampling signal in response to a rising edge of a high voltage pump enable signal and an activation of the first selection mode decision signal;

generating a second sampling pulse as the sampling signal in response to a falling edge of the high voltage pump enable signal and an activation of the second selection mode decision signal; and generating a periodic clock signal as the sampling signal in response to activation of the third selection mode decision signal.

* * * * *